(12) United States Patent
Toyoda et al.

(10) Patent No.: US 9,373,474 B2
(45) Date of Patent: Jun. 21, 2016

(54) ION SOURCE, AND MASS SPECTROSCOPE PROVIDED WITH SAME

(75) Inventors: Michisato Toyoda, Suita (JP); Jun Aoki, Suita (JP); Shinichi Miki, Chofu (JP)

(73) Assignees: Osaka University, Osaka (JP); MSI. Tokyo, Inc., Tokyo (JP)

( * ) Notice: Subject to any disclaimer, the term of this patent is extended or adjusted under 35 U.S.C. 154(b) by 47 days.

(21) Appl. No.: 13/259,152

(22) PCT Filed: Mar. 26, 2010

(86) PCT No.: PCT/JP2010/002191
§ 371 (c)(1),
(2), (4) Date: Sep. 23, 2011

(87) PCT Pub. No.: WO2010/109907
PCT Pub. Date: Sep. 30, 2010

(65) Prior Publication Data
US 2012/0025072 A1 Feb. 2, 2012

(30) Foreign Application Priority Data
Mar. 27, 2009 (JP) .................................. 2009-080001

(51) Int. Cl.
*H01J 27/02* (2006.01)
*H01J 49/40* (2006.01)
(Continued)

(52) U.S. Cl.
CPC .............. *H01J 27/024* (2013.01); *H01J 49/147* (2013.01); *H01J 49/403* (2013.01); *H01J 37/05* (2013.01); *H01J 49/14* (2013.01); *H01J 49/401* (2013.01)

(58) Field of Classification Search
CPC ................................ H01J 49/147; H01J 27/20
USPC .................................... 250/288, 286, 287, 427
See application file for complete search history.

(56) References Cited

U.S. PATENT DOCUMENTS 2,772,362 A * 11/1956 Dietz ............................. 250/298
3,678,267 A * 7/1972 Werner .......................... 250/427
(Continued)

FOREIGN PATENT DOCUMENTS

| JP | 61140047 | * | 6/1986 | .............. H01J 49/14 |
| JP | 2000-036282 A | | 2/2000 | |

(Continued)

OTHER PUBLICATIONS

International Search Report for PCT/JP2010/002191 from the Japanese Patent Office completed on Apr. 12, 2010 and mailed Apr. 20, 2010 (8 pages).
(Continued)

*Primary Examiner* — Robert Kim
*Assistant Examiner* — Kevin Chung
(74) *Attorney, Agent, or Firm* — Pyprus Pte Ltd

(57) ABSTRACT

An ion source is provided with a push-out electrode, a pull-out electrode, and a pull-in electrode all for ionizing a sample and accelerating generated ions in a pulsed manner, wherein the push-out electrode and/or the pull-in electrode has a curved surface shape having a depression curved in the direction opposite to the direction of travel of the ions. As a result, a compact ion source capable of temporally and spatially focusing ions and outputting the ions, and a compact time-of-flight mass spectroscope with good detection resolution and detection sensitivity which is provided with the compact ion source can be provided.

8 Claims, 4 Drawing Sheets

(51) Int. Cl.
*H01J 49/14* (2006.01)
*H01J 37/05* (2006.01)

(56) References Cited

U.S. PATENT DOCUMENTS

| | | | | |
|---|---|---|---|---|
| 4,149,055 | A | * | 4/1979 | Seliger et al. ............ 250/396 R |
| 4,314,180 | A | * | 2/1982 | Salisbury ..................... 376/130 |
| 4,620,102 | A | * | 10/1986 | Watanabe et al. ............. 250/427 |
| 5,742,049 | A | | 4/1998 | Holle et al. |
| 6,080,985 | A | * | 6/2000 | Welkie et al. ................. 250/287 |
| 2002/0092980 | A1 | * | 7/2002 | Park ............................. 250/288 |
| 2002/0100870 | A1 | * | 8/2002 | Whitehouse et al. ......... 250/281 |
| 2004/0079874 | A1 | * | 4/2004 | Bateman ............... H01J 49/004 250/281 |
| 2006/0016978 | A1 | * | 1/2006 | McCauley et al. ........... 250/288 |
| 2006/0237641 | A1 | * | 10/2006 | Moeller et al. ................ 250/288 |
| 2008/0290269 | A1 | * | 11/2008 | Saito et al. .................... 250/287 |
| 2010/0076712 | A1 | * | 3/2010 | Aoki et al. ...................... 702/98 |

FOREIGN PATENT DOCUMENTS

| | | |
|---|---|---|
| JP | 2000-048763 A | 2/2000 |
| JP | 2001-155677 A | 6/2001 |
| JP | 2003-257360 A | 9/2003 |
| JP | 2008-300265 A | 12/2008 |

OTHER PUBLICATIONS

W.C. Wiley and I. H. McLaren, "Time-of-Flight Mass Spectrometer with Improved Resolution" The Review of Scientific Instruments 1955, vol. 26, No. 12, pp. 1150-1157.

Michisato Toyoda, Diasuke Okumura, Mono Ishihara and Itsuo Katakuse, "Multi-turn Time -of Flight Mass Spectrometers with Electrostatic Sectors" J. Mass Spectrom., 38 (2003), pp. 1125-1142.

Toshio Ichihara et al. "Tenohira size no multiturn hikoujikangatashitsuryobunsekikei" MULTUM-S "no seisaku" J. Mass Spectrom, Soc. Japan 2007, vol. 55, No. 6, pp. 363-368.

* cited by examiner (a)

(b)

(a)

(b)

(a)
Intensity of Ion: weak / Width of Peak: narrow (b)
Intensity of Ion: strong / Width of Peak: broad

ION SOURCE, AND MASS SPECTROSCOPE PROVIDED WITH SAME

TECHNICAL FIELD

The present invention relates to an ion source that has an electrode with a curved depression (a curved surface shape). The ion source can output ions after it generates the ions and can supply temporal and special focusing. The present invention also relates to a mass spectrometer which has the above ion source.

BACKGROUND ART

In a mass spectroscope, anion source generates ions, and causes the ions to travel in vacuum circumstance. The ions are introduced into a mass analyzer that separates the ions in accordance with the mass-to-charge ratio, by means of an electromagnetic force or a difference in time of flight, for example. In a case of a time-of-flight mass spectroscope that uses the above mentioned difference in flight time of ions, the ion source needs to give kinetic energy to ions in a pulsed manner (in a predetermined period of time). Thus it is important not only spatial convergence but also temporal convergence. Spatial convergence affects detection sensitivity, and temporal convergence affects mass resolution.

Ion sources used in time-of-flight mass spectroscopes have those which perform temporal convergence such as a two-stages acceleration method (see Non-Patent Document 1), a time lag focusing method, or an orthogonal acceleration method, and those which perform spatial convergence by forming a pinhole in a pull-out electrode (described later in detail). However, the ion sources used in time-of-flight mass spectroscopes do not include those which perform both temporal convergence and spatial convergence. A parallel and uniform field can be generated if a push-out electrode (described later in detail) and the pull-out electrode are infinitely large parallel plate electrodes. Therefore, in conventional cases, an ion source that supposedly performs both temporal convergence and spatial convergence is realized by using large parallel plate electrodes as the push-out electrode and the pull-out electrode, or increasing the size of the ion source.

Meanwhile, mass spectroscopes are widely used as indispensable analytical instruments in various fields such as analytical science, bioscience, pharmacy, medicine, environmental science, and space science. Previously, large-sized instruments installed in research institutes are normally used. In recent years, however, instruments were more and more often brought in on-site analysis. In this trend, there is an increasing demand for instrument portability. Therefore, the inventors have been making efforts to reduce the sizes of time-of-flight mass spectroscopes (see Non-Patent Documents 2 and 3), and there has been a need to form ion sources having smaller sizes than conventional sizes. As a result, it has become difficult to perform both temporal convergence and spatial convergence in an ion source. In the following, this aspect is described, with reference to FIGS. 5A and 5B.

FIGS. 5A and 5B are diagrams schematically showing the structure of an ion source 110 that is formed to have a smaller size than a conventional size. Reference symbol A in FIG. 5A and reference symbol B in FIG. 5B represent the trajectories of ions. The ion source 110 is an ion source using the above mentioned two-stages acceleration method.

The ion source 110 generally has three electrodes for outputting ions after generating the ions and causing the ions to converge, and an electron gun (not shown) that emits an electron beam. The three electrodes are, from the left-hand side of the drawing, a push-out electrode 101, a pull-out electrode 102, and a pull-in electrode 103. As shown in the drawing, the push-out electrode 101 is formed in a cup-like shape, so as to maintain the sealing properties of an ion generation area 104 and reduce the size of the ion source 110. The pull-out electrode 102 is designed to have a mesh-like form to allow ions to pass through. The pull-in electrode 103 has a hole through which ions are to pass. The electron beam emitted from the electron gun is surrounded by the push-out electrode 101 and the pull-out electrode 102, and is introduced into the ion generation area 101 in which ions are to be generated. To enable the introduction, a hole (not shown) through which the electron beam is to pass is formed in either side face of the push-out electrode 101 formed in a cup-like shape.

In the ion source 110, voltages of the same potential are applied to the push-out electrode 101 and the pull-out electrode 102, and the pull-in electrode 103 is set at 0 V (this is merely an example, and this potential is not necessarily used). With this arrangement, the push-out electrode 101 and the pull-out electrode 102 have a different potential from that of the pull-in electrode 103, and ions are generated in the ion generation area 104. After that, the pull-in electrode 103 remains at 0 V, voltages are applied so that a potential difference is created between each two of the push-out electrode 101, the pull-out electrode 102, and the pull-in electrode 103. The ions generated in the ion generation area 104 are pulled into an acceleration area existing between the pull-out electrode 102 and the pull-in electrode 103 by the electrical field formed by the push-out electrode 101 and the pull-out electrode 102. The ions pulled into the acceleration area are emitted through a hole in the pull-in electrode 103 while being accelerated. Since the push-out electrode 101 needs to output ions in a pulsed manner as described above, a pulse voltage is applied to the push-out voltage 101 at the time of ion acceleration.

As described above, in the ion source 110, ions that are accelerated simultaneously in two steps and have different initial locations in the ion source can be made to reach a specific location at the same time. Also, the specific location can be changed to any other location by appropriately adjusting the voltages to be applied to the push-out electrode 101 and the pull-out electrode 102.

An ion source 110 that is smaller than a conventional one, if conditions are set so that the isopotential lines that are the same as those of a conventional parallel plate electrodes are substantially parallel to one another as shown in FIG. 5A, the area from which ions can be pulled out becomes narrower and the amount of ions obtained becomes smaller, which resultes in a lower peak intensity. On the other hand, if conditions are set so that a large amount of ions can be pulled out as shown in FIG. 5B, the time convergence of ions becomes poorer due to the curves in the isopotential lines. Thus, the peak intensity and the peak width cannot have optimum values at the same time.

The above described energies are selected, because the time-of-flight mass spectroscope used by the inventors is of a multi-turn type that causes the ions output from the ion source to move around in the same space several times, so as to increase the distance of flight (see Non-Patent Documents 2 and 3), and a fan-shaped electrical field exists behind the ion source. If a electric sector field does not exist, it will be observed that both the peak intensity and the peak width become greater, though not shown in the drawings.

PRIOR ART DOCUMENTS

Patent Document

Patent Document 1: U.S. Pat. No. 5,742,049 (Date of Publication: Apr. 21, 1998)

Non-Patent Documents

Non-Patent Document 1: W. C. Wiley and I. H. McLaren, "Time-of-Flight Mass Spectrometer with Improved Resolution," THE REVIEW OF SCIENTIFIC INSTRUMENTS, 1955, Vol. 26, No. 12, pp. 1150-1157.

Non-Patent Document 2: Michisato Toyoda, Daisuke Okumura, Mario Ishihara, and Itsuo Katakuse, "Multi-Turn Time-of-Flight Mass Spectrometers with Electrostatic Sectors," J. Mass Spectrom., 38(2003), 1125-1142.

Non-Patent Document 3: Toshio Ichihara and five others, "Tenohira-saizu no Multi-Turn Hikou-Jikan gata Shituryo-Bunseki Kei (Construction of a Palmtop Size Multi-Turn Time-of-Flight Mass Spectrometer 'MULTUM-S')," J. Mass Spectrom. Soc. Jpn, 2007, Vol. 55, No. 6, pp. 363-368.

DISCLOSURE OF THE INVENTION

Problems to be Solved by the Invention

As described above, conventional ion sources used in time-of-flight mass spectroscopes cannot perform both temporal convergence and spatial convergence. Thus an ideal condition was created by increasing the size of an ion source. Therefore, the ideal ion source that can perform convergences with small size can no longer be maintained.

The present invention has been made to solve the above drawbacks. Thus an object thereof is to provide an ion source that can reduce the instrument size and output ions after generating the ions and causing the ions to temporally and spatially converge, and a mass spectroscope including the ion source.

Means for Solving the Problems

To solve the above described problem, an ion source (hereinafter also referred to as the "first ion source," where necessary) according to the present invention has a first electrode and a second electrode that are configured to ionize sample to obtain ions and accelerate the ions. The first electrode and the second electrode are arranged in this order in the traveling direction of the ions. At least the first electrode has a shape with a depression curved in the opposite direction to the traveling direction of the ions.

The ion source according to the present invention has at least the first electrode that has a shape with a depression curved in the opposite direction to the travelling direction of ions. With this structure, an optimum potential distribution can be formed at the time of ion acceleration, and a large amount of ions can be pulled out while the ions exist on the curved isopotential planes are caused to temporally converge by giving temporal isometry to the respective acceleration paths. Accordingly, the problem that the peak intensity and the peak width cannot have optimum values at the same time as in conventional cases can be solved, and ions can be made to temporally and spatially converge and can be efficiently output (the amount of ions to be output being dramatically increased).

When both of the first electrode and the second electrode have the shape with the above described depression, the above technical effect improves.

Thus, the ion source can be provided as an ion source that can reduce the instrument size, and is capable of outputting ions after generating the ions and causing the ions to temporally and spatially converge.

To solve the above described problem, other aspect of the invention relates to an ion source that includes a first electrode, a second electrode, and a third electrode that are configured to ionize sample to obtain ions and accelerate the ions. The first electrode and the second electrode are arranged in the order of the first electrode to the second electrode in the traveling direction of the ions. The third electrode is placed between the first electrode and the second electrode. At least one of the first electrode and the third electrode preferably has a shape with the above described depression.

This ion source according to the present invention further includes the third electrode, as opposed to the first ion source, and at least one of the first electrode and the third electrode has a shape with the above described depression. Accordingly, the above described effect of the first ion source becomes even greater.

To solve the above described problem, a mass spectroscope according to the present invention is a mass spectroscope that ionizes a sample, moves ions obtained through the ionization in vacuum, separates and detects the ions in accordance with a mass-to-charge ratio to obtain a mass spectrum, and analyzes the sample with the use of the mass spectrum. This mass spectroscope characteristically includes the above described ion source for the ionization.

Also, the mass spectroscope according to the present invention is preferably a time-of-flight mass spectroscope that performs the separation and the detection with the use of a difference in time of flight of the ions. The time-of-flight mass spectroscope has a fan-shaped electrical field, and the energy for the ions is selected in the fan-shaped electrical field.

In the above described structure, the mass spectroscope according to the present invention includes the ion source that can be made smaller in size while maintaining its functions. Thus, a small-sized, high-performance mass spectroscope can be realized.

Advantageous Effect of the Invention

An ion source (the first ion source) according to the present invention has a feature that it has a first electrode and a second electrode that are designed for ionizing one or pluralities of samples to obtain one or pluralities of ions and accelerating the ions obtained through the ionization. The first electrode and the second electrode are arranged in the order of the first electrode to the second electrode in the traveling direction of the ions. At least the first electrode characteristically has a shape with a depression curved in the opposite direction to the traveling direction of the ions.

In the ion source according to the present invention having the above structure, at least the first electrode has a shape with a depression curved in the opposite direction to the travelling direction of ions, namely reverse direction. With this structure, an optimum potential distribution can be formed at the time of ion acceleration, and a large amount of ions can be pulled out while the ions existing on the curved isopotential planes are caused to temporally converge by giving temporal isometry to the respective acceleration paths. Accordingly, the problem that the peak intensity and the peak width cannot have optimum values at the same time as in conventional cases can be solved, and ions can be made to temporally and spatially converge and can be efficiently output (the amount of ions to be output being dramatically increased).

Thus, the ion source can be provided as an ion source that can reduce the instrument size, and is capable of outputting ions after generating the ions and causing the ions to temporally and spatially converge.

As opposed to the first ion source, an ion source according to the present invention may further include a third electrode. The first electrode and the second electrode are arranged in the order of the first electrode to the second electrode in the traveling direction of the ions, and the third electrode is placed between the first electrode and the second electrode. At least one of the first electrode and the third electrode preferably has a shape with the above described depression.

This ion source according to the present invention further includes the third electrode, as opposed to the first ion source, and at least one of the first electrode and the third electrode has a shape with the above described depression. Accordingly, the above described effect of the first ion source becomes even greater. It is particularly critical that the electrode paired with the second electrode for accelerating ions has a shape having the above described depression. Therefore, in a case where the third electrode have a shape with the above described depression, the above described effect becomes even greater. Also, the above described effect becomes even greater in a case where two or more electrodes have a shape with the above described depression than in a case where only one electrode has such a shape.

A mass spectroscope according to the present invention is a mass spectroscope that ionizes a sample, moves generated ions in vacuum, separates and detects the ions in accordance with a mass-to-charge ratio to obtain a mass spectrum, and analyzes the sample with the use of the mass spectrum. This mass spectroscope characteristically includes the above described ion source for the ionization.

In the above described structure, the mass spectroscope according to the present invention includes the ion source that can be made smaller in size while maintaining its functions. Thus, a small-sized, high-performance mass spectroscope can be realized.

BEST MODE FOR CARRYING OUT THE INVENTION

The following is a description of embodiments of the present invention, with reference to FIGS. 1 through 4.

Figure 1:
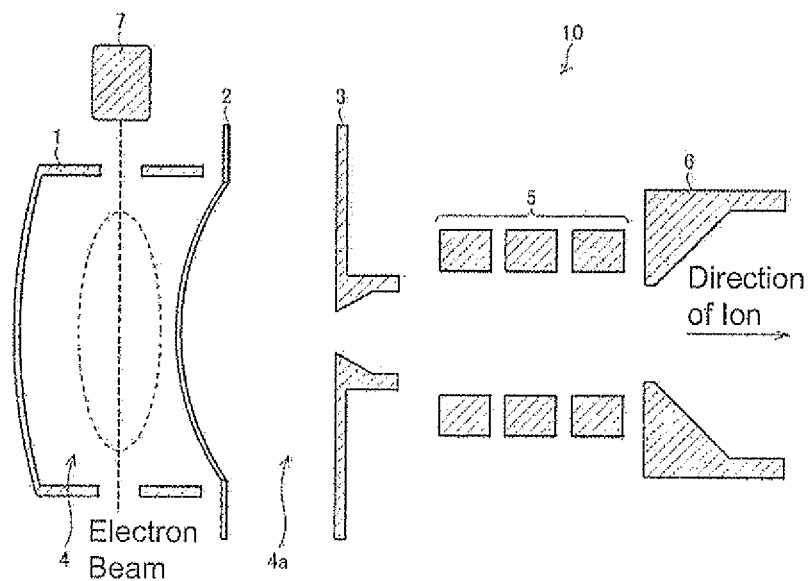
FIG. 1 is a diagram schematically showing the structure of an ion source according to an embodiment of the present invention.
Figure 2:
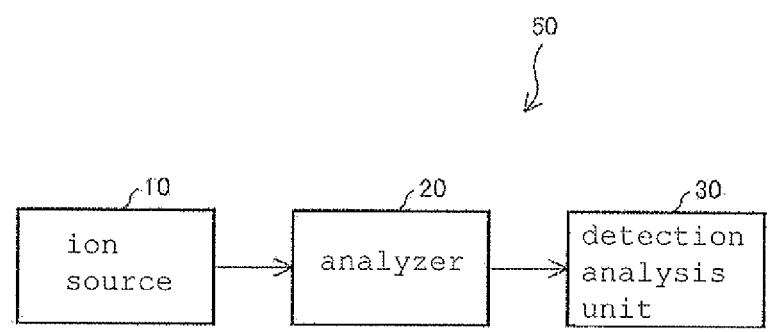
FIG. 2 is a block diagram schematically showing the structure of a mass spectroscope according to the embodiment of the present invention.
Figure 3:
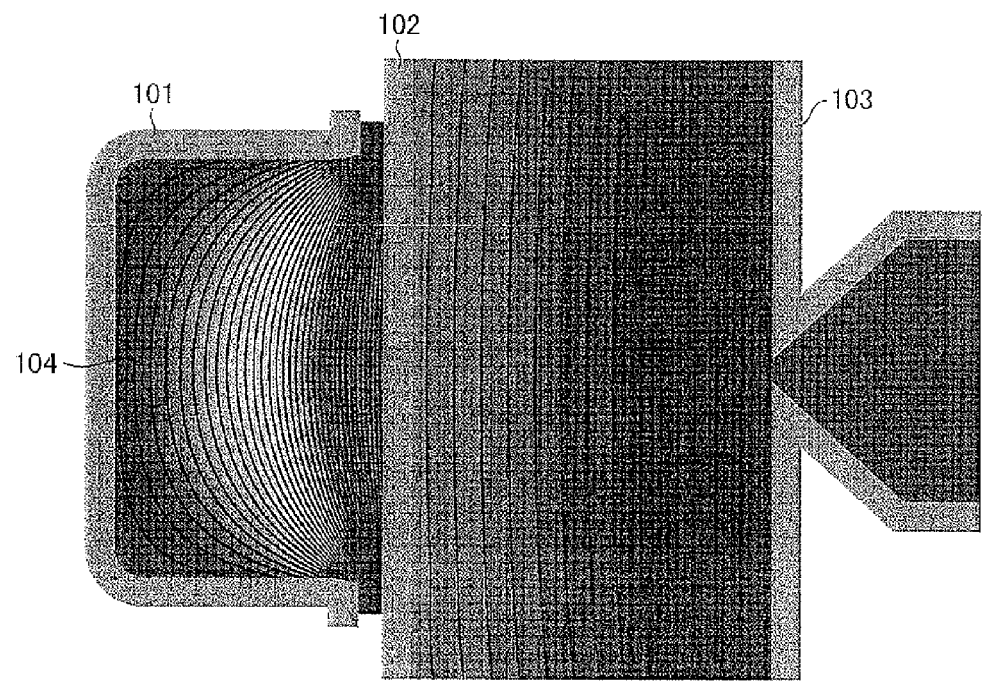
FIG. 3A is a diagram showing a potential distribution in the conventional ion source illustrated in FIGS. 5A and 5B.
FIG. 3B is a diagram showing a potential distribution in the ion source illustrated in FIG. 1.
Figure 3:
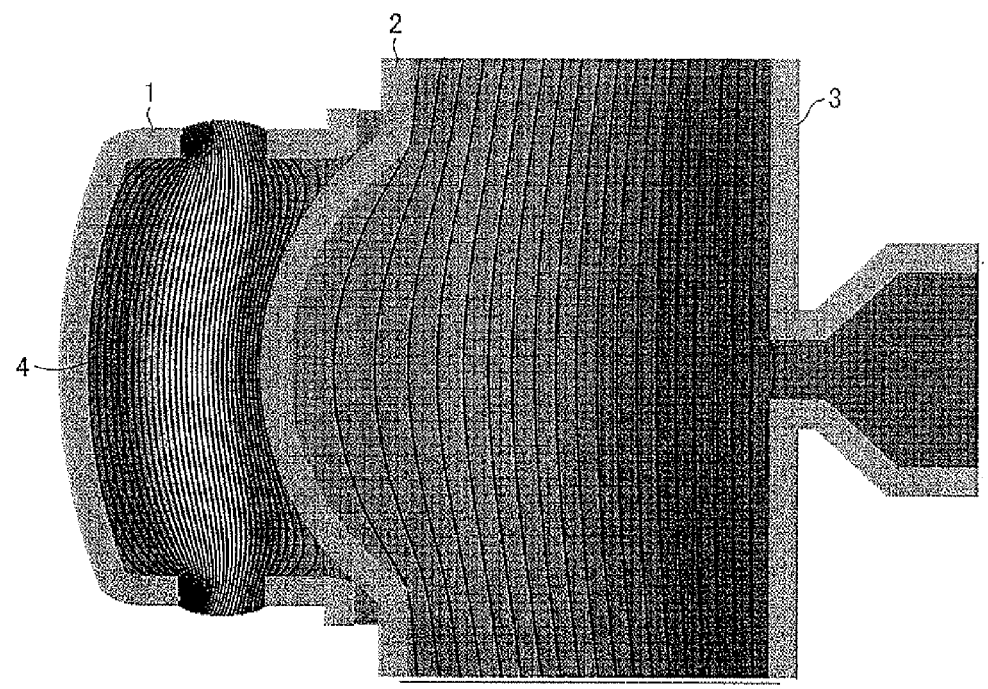
Figure 4:
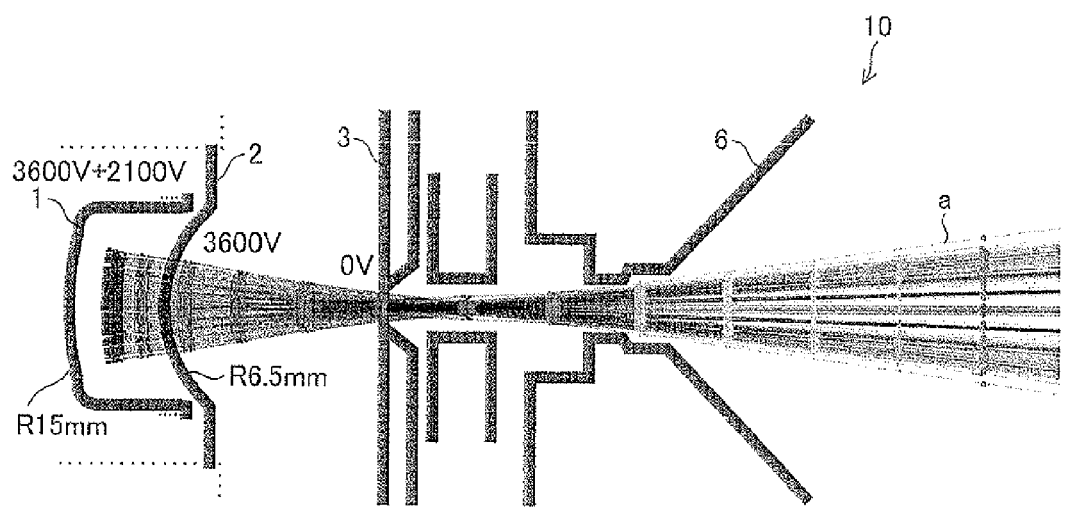
FIGS. 4A and 4B illustrate examples of the ion source illustrated in FIG. 1, and schematically show the structures of the ion sources according to the examples.
Figure 4:
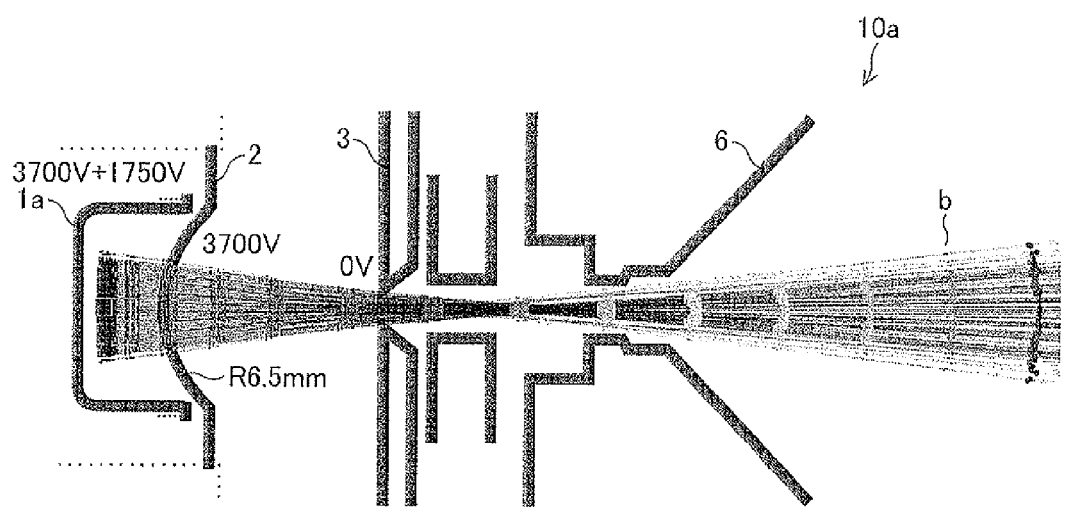

FIG. 1 is a diagram schematically showing the structure of an ion source 10 according to an embodiment of the present invention. FIG. 2 is a block diagram schematically showing the structure of a mass spectroscope 50 according to the embodiment of the present invention.

As shown in FIG. 2, the mass spectroscope 50 roughly includes: the ion source 10 that ionizes a sample; an analyzer 20 that causes generated ion to move in vacuum and performs a separation analysis on those ions in accordance with the mass-to-charge ratio, using an electromagnetic force, the difference in time of flight, or the like; and a detection/data analysis unit 30 that detects the separated ions, and analyzes the sample, using the mass spectrum obtained through an analysis performed on the detected data. The analyzer 20 may be of a reflectron type or a time-of-flight type using the above mentioned difference in time of flight, and more particularly, may be of a time-of-flight type that has a fan-shaped electrical field and selects an energy for the ions in the fan-shaped electrical field, a multi-turn time-of-flight type that is a kind of the time-of-flight type and performs the separation and detection by turning the ions around in the same flight space several times (see Non-Patent Documents 2 and 3), or the like.

As shown in FIG. 1, the ion source 10 roughly includes: a push-out electrode (the first electrode) 1, a pull-out electrode (the third electrode) 2, and a pull-in electrode (the second electrode) 3 that are designed for ionizing a sample and accelerating the generated ions in a pulsed manner; an electrostatic lens electrode 5 formed with three cylindrical electrodes; a connecting electrode 6 for connecting the ion source 10 to devices in later stages than the ion source 10; and an electron gun 7 that emits an electron beam. The push-out electrode 1, the pull-out electrode 2, the pull-in electrode 3, the electrostatic lens electrode 5, and the connecting electrode 6 are arranged in this order, and this determines the travelling direction of ions.

The electrostatic lens electrode 5 can increase the space convergence of ions, and this electrode may be omitted. The ion source 10 is an ion source using a two-step acceleration method, but may be an ion source using a single-step acceleration method. By the single-step acceleration method, a sample is ionized by the two electrodes of a push-out electrode and a pull-in electrode, and the generated ions are accelerated in a pulsed manner. Alternatively, the ion source 10 may be an ion source using a multi-step (such as three-step or four-step) acceleration method. In such a case, at least one electrode (not shown) for controlling the electrical field in an acceleration area $4a$ is provided between the pull-out electrode 2 and the pull-in electrode 3, depending on how many steps are involved in the acceleration method.

The electron beam emitted from the electron gun 7 is surrounded by the push-out electrode 1 and the pull-out electrode 2, and is introduced into an ion generation area 4 in which ions are to be generated. To enable the introduction, a hole through which the electron beam is to pass is formed in either side face of the push-out electrode 1 formed in a cup-like shape.

The push-out electrode 1 is formed in a cup-like shape to maintain the sealing properties of the ion generation area 4 and reduce the size of the ion source 10. The pull-out electrode 2 is designed to have a mesh-like form through which ions are to pass. The pull-out electrode 2 may be designed to have not only a mesh-like form but also holes through which ions are to pass. The pull-in electrode 3 has a hole through which ions are to pass. The hole of the pull-in electrode 3 may be an extremely small hole or a so-called pinhole, and in that case, a convergence action by virtue of a lens effect can be expected. It can be said that the push-out electrode 1 and the pull-out electrode 2 have the functions to push and pull the ions generated in the ion generation area 4 toward the acceleration area 4a that is an area for accelerating the ions and is located between the pull-out electrode 2 and the pull-in electrode 3. Also, it can be said that the pull-in electrode 3 has the function to pull the ions accelerated in the acceleration area 4a into the area in a stage after the pull-in electrode 3.

It should be noted here that, in this embodiment, the bottom of the push-out electrode 1 formed in a cup-like shape, the pull-out electrode 2, and the pull-in electrode 3 are formed in a shape having a depression (a curved surface shape) curved in the opposite direction to the traveling direction of ions. With this structure, an optimum potential distribution can be formed in the ion generation area 4 and the acceleration area 4a, and a large amount of ions can be pulled out while time convergence is performed on ions existing on the curved isopotential planes by giving temporal isometry to the respective acceleration paths. Accordingly, the problem that the peak intensity and the peak width cannot have optimum values at the same time as in conventional cases can be solved, and ions can be made to temporally and spatially converge and can be efficiently output (with a dramatically improved pull-out efficiency). Thus, the ion source 10 can be provided as an ion source that can contribute to a reduction in instrument size, and is capable of outputting ions after generating the ions and causing the ions to temporally and spatially converge.

To cause ions to temporally converge, the temporal isometry before the ions generated at various locations in the ion generation area 4 needs to be satisfied. To cause ions to spatially converge, a lens effect needs to be obtained, and a focal point needs to be adjustable onto the position of the pull-in electrode 3. It can be said that the above mentioned optimum potential distribution is a potential distribution having such a shape as to satisfy those conditions. It can also be said that the shape of the above mentioned optimum potential distribution is a shape having curves with isopotential lines that are concentric with respect to the hole in the pull-in electrode 3.

FIG. 3A is a diagram showing a potential distribution in the above described conventional ion source 110. FIG. 3B is a diagram showing a potential distribution in the ion source 10. In FIGS. 3A and 3B, respective portions are colored in accordance with potential intensity, and the portions colored in red are the portions having the highest potential intensity. As is apparent from those drawings, unlike the isopotential lines in the acceleration area in the conventional ion source 110, the isopotential lines in the acceleration area 4a in the ion source 10 are curved, and contribute to the temporal isometry among the respective acceleration paths. Also, an optimum potential distribution for temporal convergence and spatial convergence is formed in the ion generation area 4.

Specifically, the electrode having a shape with the above described depression is embodied only by the push-out electrode 1, only by the pull-out electrode 2 (the later described Example 1), by a combination of the push-out electrode 1 and the pull-out electrode 2 (the later described Example 2), or by a combination of the push-out electrode 1, the pull-out electrode 2, and the pull-in electrode 3. The above described effect becomes even greater in a case where multiple electrodes have a shape with the above described depression than in a case where only one electrode has the shape with the depression.

In the ion source 10, voltages of the same potential are applied to the push-out electrode 1 and the pull-out electrode 2 while the pull-in electrode 3 is set at 0 V (this is merely an example, and this potential is not necessarily used), so that the push-out electrode 1 and the pull-out electrode 2 have a different potential from that of the pull-in electrode 3, and ions are generated in the ion generation area 4. After that, the pull-in electrode 3 remain at 0 V, and voltages are applied so that a potential difference is created between each two of the push-out electrode 1, the pull-out electrode 2, and the pull-in electrode 3. The ions generated in the ion generation area 4 are pulled toward the acceleration area 4a by the electrical field formed by the push-out electrode 1 and the pull-out electrode 2. Those ions are accelerated in the acceleration area 4a, and pass through the pull-in electrode 3. The ions having passed through the pull-in electrode 3 are further made to spatially converge by the electrostatic lens electrode 5, and are introduced into the analyzer 20 in the later stage via the connecting electrode 6.

At the time of ion acceleration, there is a need to output ions in a pulsed manner, and therefore, a pulse voltage is applied to the push-out electrode 1. However, the present invention is not limited to that, and the ionization may be performed in a pulsed manner (ionization is performed with a pulse laser, for example). The ionization is not limited to the above described electronic ionization.

In the ion source 10, ions are accelerated in two-stages as described above, so that ions that are simultaneously accelerated and have different initial locations can be made to reach a specific location at the same time. Also, the specific location can be changed to any other location by appropriately adjusting the voltages to be applied to the push-out electrode 1 and the pull-out electrode 2.

As described above, in the ion source 10 according to this embodiment, the specific combination of the push-out electrode 1, the pull-out electrode 2, and the pull-in electrode 3 for ionizing a sample and accelerating the generated ions in a pulsed manner has a shape with a depression curved in the opposite direction to the travelling direction of ions. With this structure, an optimum potential distribution can be formed in the ion generation area 4 and the acceleration area 4a, and a large amount of ions can be pulled out while the ions existing on the curved isopotential planes are made to temporally converge by giving temporal isometry to the respective acceleration paths. Accordingly, the problem that the peak intensity and the peak width cannot have optimum values at the same time as in conventional cases can be solved, and ions can be made to temporally and spatially converge and can be efficiently output.

The mass spectroscope 50 according to this embodiment including the ion source 10 can be a small-sized, high-performance mass spectroscope, as the ion source 10 can be made smaller in size while maintaining the above described functions. If small-sized mass spectroscopes are realized, those mass spectroscopes will provide unprecedented portability, and such mass spectroscopes will be more widely used as indispensable analytical instruments in various fields such as analytical science, bioscience, pharmacy, medicine, environmental science, and space science.

Referring now to FIGS. 4A and 4B, examples of the ion source 10 are described. FIGS. 4A and 40 illustrate examples of the ion source 10, and are diagrams schematically showing the structures of ion sources according to the examples. For ease of explanation, the components having the same functions as the components of the ion source 10 illustrated in FIG. 1 are denoted by the same reference numerals as those used in FIG. 1, and explanation of them is not repeated. In those examples, each analyzer 20 is of the above described multi-turn time-of-flight type.

Example 1

FIG. 4A illustrates the above mentioned ion source 10. FIG. 4B illustrates an ion source 10a in which the electrode having the above described depression is formed only by the pull-out electrode 2 (the push-out electrode being a push-out electrode 1a not having the above described depression), as opposed to the ion source 10. Reference symbol a in FIG. 4A and reference symbol b in FIG. 4B represent the respective ion trajectories.

Figure 5:
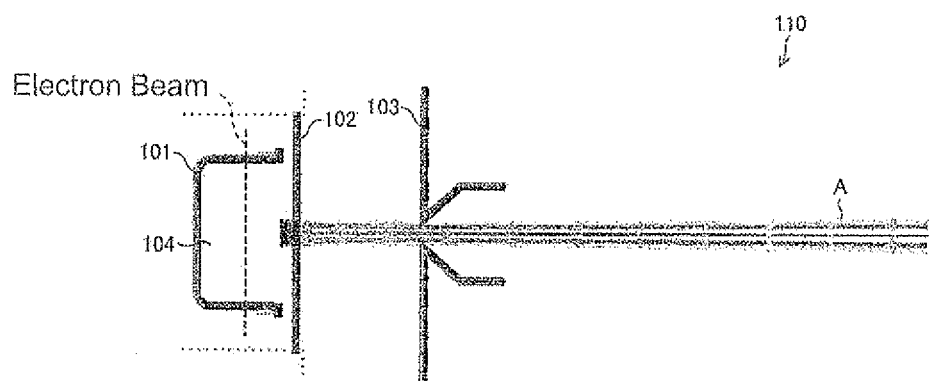
FIGS. 5A and 5B are diagrams schematically showing the structure of a conventional ion source.
Figure 5:
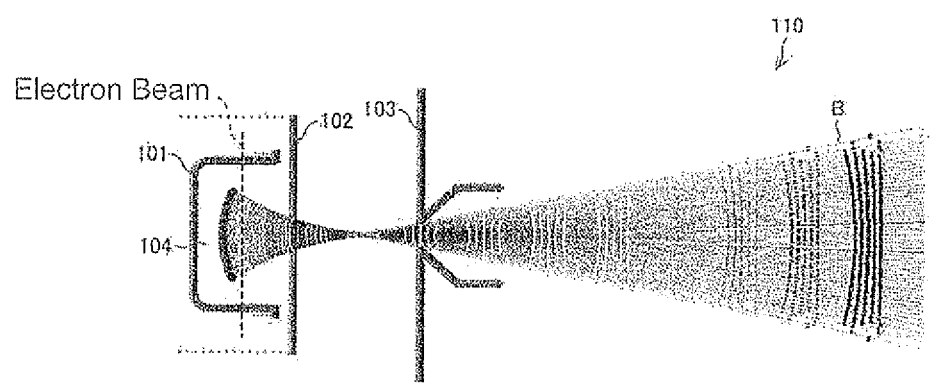

In the ion source 10 illustrated in FIG. 4A, the push-out electrode 1 has a curved surface shape of 15 mm in radius (the curvature R=15 mm), and the pull-out electrode 2 has a curved surface shape of 6.5 mm in radius (the curvature R=6.5 mm). The distance between the push-out electrode 1 and the pull-out electrode 2 is 6.5 mm, and the distance between the pull-out electrode 2 and the pull-in electrode 3 is 9 mm. Voltages are applied so that a potential difference of 2.1 kV is generated between the push-out electrode 1 and the pull-out electrode 2 at the time of ion acceleration, and a potential difference of 3.6 kV is generated between the pull-out electrode 2 and the pull-in electrode 3 at the time of ion acceleration. The pull-out electrode 2 has a mesh structure with a large number of holes of 0.5 mm in diameter. The hole in the pull-in electrode 3 has a diameter of 2 mm. Under such conditions, as shown in the drawing, ions that are pulled out exhibit both temporal and spatial convergences at the same time, as is more apparent from a comparison with FIG. 5.

Example 2

In the ion source 10a illustrated in FIG. 4B, the pull-out electrode 2 has a curved surface shape of 6.5 mm in radius (the curvature R=6.5 mm). The distance between the push-out electrode 1 and the pull-out electrode 2 is 6.5 mm, and the distance between the pull-out electrode 2 and the pull-in electrode 3 is 9 mm. Voltages are applied so that a potential difference of 1.75 kV is generated between the push-out electrode 1 and the pull-out electrode 2 at the time of ion acceleration, and a potential difference of 3.7 kV is generated between the pull-out electrode 2 and the pull-in electrode 3 at the time of ion acceleration. The pull-out electrode 2 has a mesh structure with a large number of holes of 0.5 mm in diameter. The hole in the pull-in electrode 3 has a diameter of 2 mm. Under such conditions, as shown in the drawing, ions that are pulled out exhibit both temporal and spatial convergences at the same time, as is more apparent from a comparison with FIG. 5.

The present invention is not limited to the above described respective embodiments, and various modification may be made to them within the scope of the claimed invention. The technical scope of the present invention includes any embodiments that are formed by combining the technical measures disclosed in different embodiments.

INDUSTRIAL APPLICABILITY

Since an ion source according to the present invention can be made smaller in size while maintaining its functions, a mass spectroscope according to the present invention including the ion source can be a small-sized, high-performance mass spectroscope. Such a mass spectroscope can be widely used as an indispensable analytical instrument in various fields such as analytical science, bioscience, pharmacy, medicine, environmental science, and space science.

DESCRIPTION OF REFERENCE NUMERALS

1, 101 push-out electrode (first electrode)
2, 102 pull-out electrode (third electrode)
3, 103 pull-in electrode (second electrode)
4, 104 ion generation area
10 ion source
50 mass spectroscope

The invention claimed is:

1. An ion source for a time-of-flight mass spectrometer comprising:
    an electron gun which emits an electron beam;
    a first electrode, a second electrode, and a third electrode that are configured to ionize a sample to obtain ions and accelerate the ions in a pulsed manner to obtain pulsed ions;
    wherein the electron beam is introduced into an ion generation area between the first electrode and the third electrode;
    wherein the first electrode, the third electrode and the second electrode are arranged in this order in a travelling direction of the ions;
    wherein the first electrode is configured to push the ions;
    wherein the third and the second electrodes are configured to pull the ions;
    wherein the first electrode has a shape with a depression curved in the opposite direction to the travelling direction of the ions such that curved isopotential planes are formed at the time of ion acceleration and the ions can be pulled out while the ions existing on the curved isopotential planes are caused to temporally converge by giving temporal isometry to respective acceleration paths;
    wherein the third electrode has a shape with a depression curved in the opposite direction to the travelling direction of the ions, the depression curves are configured to make the pulsed ions exiting a hole through the second electrode temporally and spatially converge;
    wherein a voltage difference between the first and the third electrodes is 1750V to 2100V and a voltage difference between the third and the second electrode is 3600V to 3700V.

2. A time-of-flight mass spectroscope comprising an ion source to ionize a sample to obtain ions, a part to separate the ions and a part to obtain a mass spectrum using the separated ions,
    wherein the ion source comprises an electron gun which emits an electron beam, a first electrode, a second electrode, and a third electrode that are configured to ionize the sample to obtain ions and accelerate the ions in a pulsed manner to obtain pulsed ions;
    wherein the first electrode, the third electrode and the second electrode are arranged in this order in a travelling direction of the ions such that curved isopotential planes are formed at the time of ion acceleration and the ions can be pulled out while the ions existing on the curved isopotential planes are caused to temporally converge by giving temporal isometry to respective acceleration paths;
    wherein the electron beam is introduced into an ion generation area between the first electrode and the third electrode;
    wherein the first electrode is configured to push the ions;
    wherein the third and the second electrodes are configured to pull the ions;
    wherein the first electrode has a shape with a depression curved in the opposite direction to the travelling direction of the ions; and
    wherein the third electrode has a shape with a depression curved in the opposite direction to the travelling direction of the ions, the depression curves are configured to make the pulsed ions exiting a hole through the second electrode temporally and spatially converge;

wherein a voltage difference between the first and the third electrodes is 1750V to 2100V and a voltage difference between the third and the second electrode is 3600V to 3700V.

3. A time-of-flight mass spectroscope in accordance with claim 2,
Wherein separation and detection of the ions depend on a difference in time of flight of the ions, and
wherein the time-of-flight mass spectroscope further comprises a fan-shaped electrical field and the ions are selected based on their energy in the fan-shaped electrical field.

4. An ion source in accordance with claim 1, wherein the third electrode comprises a mesh.

5. An ion source in accordance with claim 1, wherein the ion source controls voltages of the same potential that are applied to the first and the third electrodes such that the ions are generated in an ion generation area, the ion generation area being between the first and the third electrodes;
wherein, after the ions generated, the ion source controls voltages of the first, the second and the third electrodes such that a potential difference is created between the first and the third electrodes, and the third and the second electrodes, and the ions generated in the ion generation area are pulled toward an acceleration area by means of an electrical field formed between the first and the third electrode, the acceleration area being between the third and the second electrodes; and the ions in the acceleration area are accelerated by means of an electrical field formed between the third and the second electrode and pass through the second electrode.

6. An ion source in accordance with claim 1, wherein the first electrode is a push-out electrode, the second electrode is a pull-in electrode, and the third electrode is a pull-out electrode.

7. An ion source in accordance with claim 4, wherein the first electrode is a push-out electrode, the second electrode is a pull-in electrode, and the third electrode is a pull-out electrode.

8. An ion source in accordance with claim 5, wherein the first electrode is a push-out electrode, the second electrode is a pull-in electrode, and the third electrode is a pull-out electrode.

* * * * *